INVENTOR.
DANIEL R. CURRAN
ADOLPH BEROHN
BY
ATTORNEY

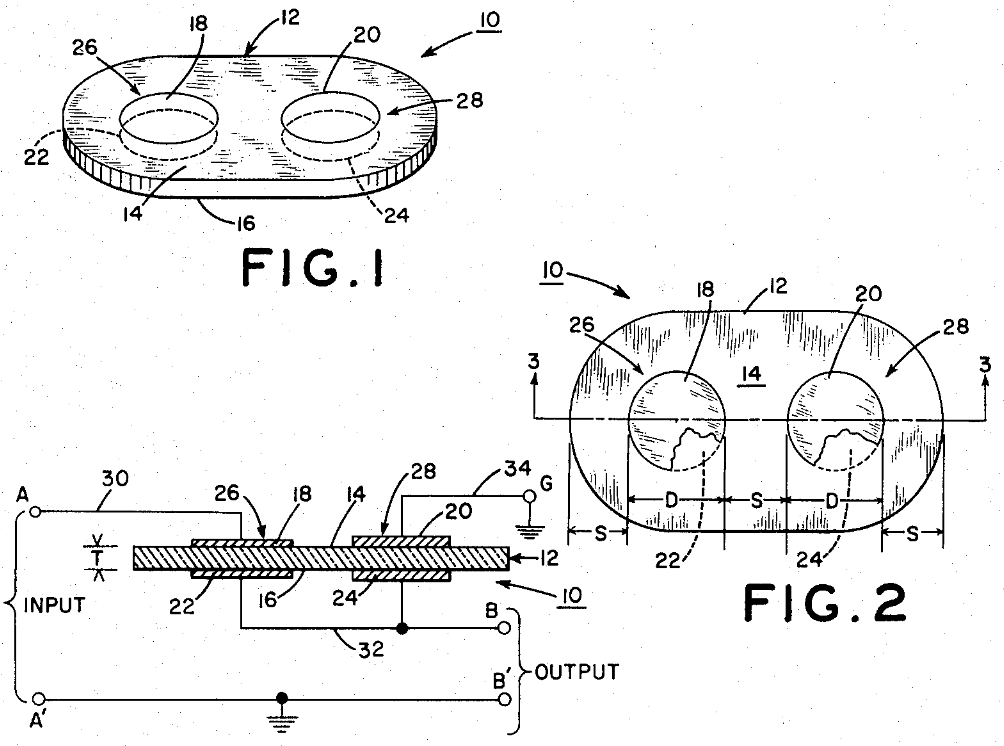
FIG. 1, FIG. 2
FIG. 3
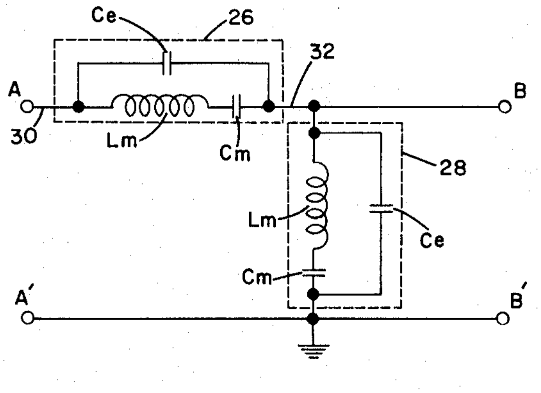
FIG. 4
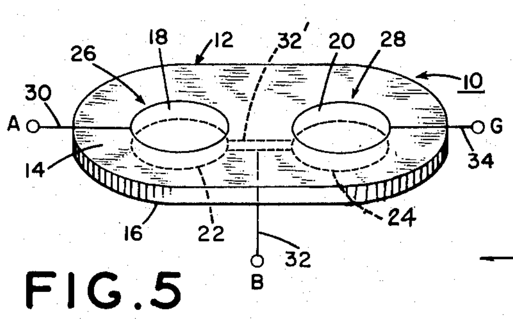
FIG. 5
INVENTOR.
DANIEL R. CURRAN
ADOLPH BEROHN
BY
Francis [signature]
ATTORNEY INVENTOR.
DANIEL R. CURRAN
ADOLPH BEROHN
BY
Francis ... Marsella
ATTORNEY

Dec. 7, 1965 D. R. CURRAN ET AL 3,222,622

WAVE FILTER COMPRISING PIEZOELECTRIC WAFER ELECTRODED TO DEFINE A PLURALITY OF RESONANT REGIONS INDEPENDENTLY OPERABLE WITHOUT SIGNIFICANT ELECTROMECHANICAL INTERACTION

Filed Aug. 14, 1962 4 Sheets-Sheet 4

INVENTOR.
DANIEL R. CURRAN
ADOLPH BEROHN

BY Francis L. Masselle

ATTORNEY 3,222,622
Patented Dec. 7, 1965

3,222,622

WAVE FILTER COMPRISING PIEZOELECTRIC WAFER ELECTRODED TO DEFINE A PLURALITY OF RESONANT REGIONS INDEPENDENTLY OPERABLE WITHOUT SIGNIFICANT ELECTRO-MECHANICAL INTERACTION

Daniel R. Curran, Cleveland Heights, and Adolph Berohn, Chesterland, Ohio, assignors to Clevite Corporation, a corporation of Ohio Filed Aug. 14, 1962, Ser. No. 216,846
31 Claims. (Cl. 333—72)

This application is a continuation-in-part of applicants' Serial No. 849,070, filed October 27, 1959, now abandoned.

This invention relates to piezoelectric circuit components for electric wave filters.

With the advent of the transistor and its increasingly wide spread use as a substitute for electron tubes, a great deal of emphasis is placed on the miniaturization of other electric components so as to fully exploit the small size of solid state amplifiers. One of the important components which heretofore has to a large extent defied miniaturization, despite concerted efforts in this direction by skilled workers in the field, is the electric wave filter, particularly filters of the high selectivity I-F band-pass type. Heretofore, wave filters have comprised networks of coils and capacitors, and/or combinations of simple piezoelectric resonators. Due to the large number of individual components involved in such filter networks and the corresponding complexity of associated mounting and housing structure, the intrinsic nature of such filters has appeared to be inconsistent with compact design.

It is, therefore, the fundamental object of the present invention to provide wave filter components of extremely small size.

More specifically, it is an object of the invention to provide sub-miniature wave filter components which are of simple physical structure as compared to conventional filters of comparable capabilities.

A further object is the provision of sub-miniature wave filter components comprising a single element functionally equivalent to complicated conventional filter networks.

A still further object is the provision of sub-miniature filter components which minimize packaging and mounting requirements, are durable in construction and can be mass produced at much lower cost than comparable conventional filter elements.

These and further objects are accomplished by piezoelectric circuit components for electric wave filters according to the present invention which comprise a relatively thin plate of piezoelectric material having at least two spaced electrodes on one major surface and, in opposition to said electrodes, counterelectrode means on the other major surface. The aggregate area of the electrodes on the one major surface is substantially less than the area of such surface. The electrodes and counterelectrode means coact with the intervening piezoelectric material to form a plurality of individual resonators which are independently vibratory in the same thickness mode but with different resonant frequencies at corresponding harmonics, fundamental or higher order.

Additional objects and advantages of the invention, its scope, and the manner in which it may be practiced will be more readily apparent to those conversant with the art from the following description and subjoined claims taken in conjunction with the annexed drawings wherein like reference characters designate like parts throughout the several views and in which:

FIGURE 1 is a perspective elevational view, on an enlarged scale, of one form of piezoelectric circuit components for wave filters in accordance with the present invention;

FIGURE 2 is a top plan view of the component shown in FIGURE 1;

FIGURE 3 is a sectional view on line 3—3 of FIGURE 2 with schematically shown terminal connections added;

FIGURE 4 is a schematic representation of the equivalent circuit of the filter component shown in FIGURES 1–3;

FIGURE 5 is a view similar to FIGURE 1 showing the same component modified by the incorporation of self-contained circuit connections;

Figures 6, 7, 8:
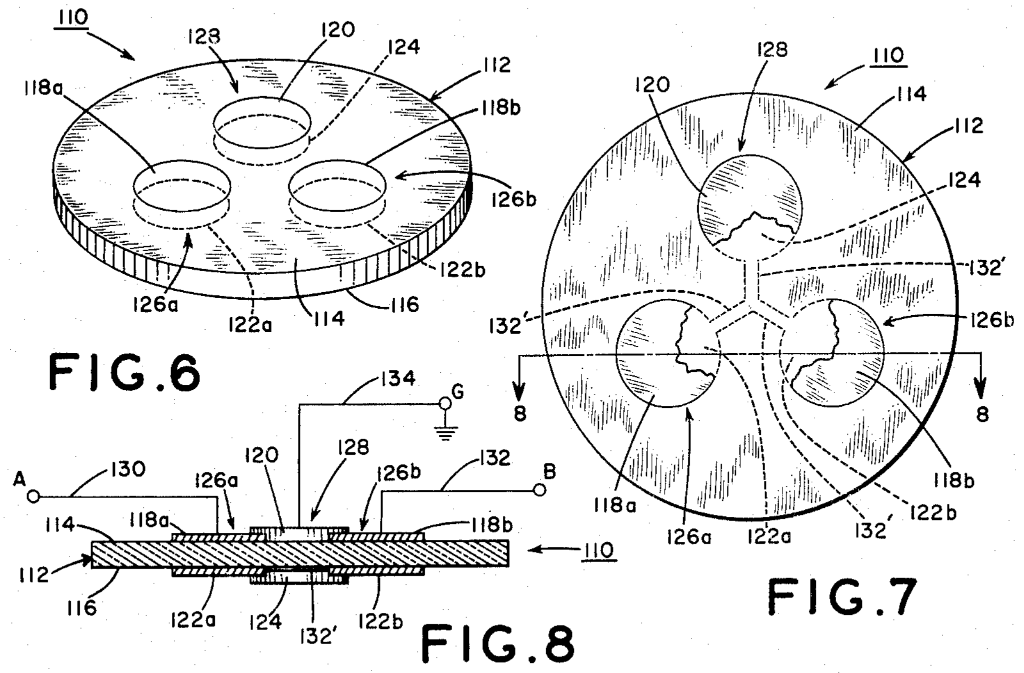
FIGURE 6 is a view similar to FIGURE 1 illustrating a modified form of filter component according to the invention.
FIGURE 7 is a top plan view of the filter component shown in FIGURE 6.
FIGURE 8 is a sectional view taken on lines 8—8 of FIGURE 7 looking in the direction of the arrows.

The simplest form of piezoelectric filter component contemplated by the present invention is illustrated in and will now be described with continued reference to FIGURES 1, 2 and 3 of the drawings wherein the component, in its entirety, is designated by reference numeral 10. Element 10 comprises a relatively thin flat plate or wafer 12 of a suitable piezoelectrically active material. Certain aspects of the shape and dimensions of wafer 12 are of fundamental importance to the invention and will be described presently in detail.

On each of its major surfaces, 14 and 16, wafer 12 is provided with two electrodes 18, 20 and counterelectrodes 22, 24 respectively. The electrodes on the respective major surfaces of wafer 12 are arrayed in opposition so as to form electrode pairs, the respective electrodes of which coact with the intervening piezoelectric material to form piezoelectric resonators. Thus, in conjunction with the intervening material, electrodes 18 and 22 define a resonator 26 and electrodes 20 and 24 define a resonator 28. The electrodes on one of the major surfaces may be replaced by a single electrode covering the entire surface or one which is of such shape, dimension and location as to oppose the electrodes on the opposite major surface. For literary ease and clarity, resonators 26 and 28, as well as their counterparts in various other embodiments of the invention yet to be described, will be referred to as "dot" resonators in the ensuing description and subjoined claims.

In accordance with the present invention both dot resonators 26 and 28 are characterized by the same thickness mode of vibration. The precise mode may be either thickness shear or thickness expansion. To this end, if wafer 12 is of a monocrystalline piezoelectric material such as quartz, Rochelle salt, DKT (di-potassium tartrate), lithium sulfate or the like, its orientation with respect to the crystallographic axes of the crystal from which it is cut is selected, in a manner well-known in the crystallographic arts, to impart to it the desired mode of vibration. Thus, for example, a "0° Z-cut" of DKT may be used for a thickness shear mode; a "0° Y-cut" of lithium sulfate for a thickness expansion mode.

Of the various monocrystalline piezoelectrics available, quartz, primarily because of its stability and extremely high mechanical quality factor ($Q_m$) would be the material of choice for wafer 12 for narrow band filters. An "AT-cut" quartz wafer responds in the thickness *shear* mode to a potential gradient between its major surfaces and is admirably suited to the purposes of the present invention. For a thickness expansion mode of response, an X-cut quartz wafer may be used.

For wider band filters, wafer 12 is fabricated of a suitable polarizable ferroelectric ceramic material such as barium titanate, lead zirconate titanate, or various chemical modifications thereof. The preferred material for the purposes of the invention from the standpoint of time and temperature stability of its various physical and piezoelectric properties are ceramic materials of the type disclosed and claimed in U.S. Letters Patent No. 3,006,857 and in copending application of Frank Kulcsar and William R. Cook, Jr., Serial No. 164,076, filed January 3, 1962, and assigned to the same assignee as the present invention.

Inasmuch as the physical configuration of filter elements according to the invention is the same whether a monocrystalline or ceramic wafer is employed, albeit there are important differences in dimensional parameters, the illustrated embodiments are applicable to and will serve as an accurate representation of either type of wafer. However, specific examples of filter elements fabricated with both quartz and ceramic wafers and operating characteristics of each will be disclosed in detail as this description proceeds.

Polarizable ferroelectric ceramic materials of the type described above have come to be referred to as "piezoelectric" ceramics by reason of the fact that they may be conditioned, i.e., electrostatically polarized, by the application of a strong D.-C. field and thereafter exhibit an electromechanical sensitivity similar to the well-known piezoelectric effect found in quartz, Rochelle salt, and like crystalline materials. Where dot resonators 26 and 28 are to operate in the thickness expansion mode at least portions of wafer 12 intervening between the respective electrodes 18, 22 and 20, 24 of each electrode pair is polarized in its thickness direction, i.e., perpendicular to the planes of major faces 14 and 16. This may be accomplished conveniently by applying the requisite D.-C. potential between electrode pairs 18, 22 and 20, 24. Element 10 may be fabricated by aplying complete electrodes to both surfaces, polarizing the entire wafer 12, and then partially removing the electrode from one or both of the major surfaces to leave the operating electrodes desired.

For operation of resonators 26 and 28 in a thickness shear mode, wafer 12, or at least the portions thereof disposed between the respective opposed electrodes, is polarized in a direction parallel to the major surfaces. Such polarization may be accomplished, for example, in the manner described in U.S. Patent No. 2,646,610 to A. L. W. Williams. Generally speaking, however, it is simpler to polarize the wafer 12 in the thickness direction and consequently operation of the resonators in the thickness expansion mode is preferred for the purposes of the invention.

Whether ceramic or crystal, the thickness dimension of wafer 12 is determined basically out of consideration for the desired resonant frequencies of the respective dot resonators. It is essential that the resonant frequencies (which may be either the fundamental or an overtone) of the respective resonators be sufficiently different to enable them to operate effectively one as the series arm and the other as the shunt arm of a ladder type filter network. In many cases the desired frequency relationship between the dot resonators is that the resonant frequency of one substantially coincides with the anti-resonant frequency of the other; however, in some cases, e.g., the ladder type filter network just mentioned, the difference between resonant frequencies of the dot resonators may be from 5 to 110% of the total difference between resonance and anti-resonance.

Inasmuch as the resonant frequency of both thickness shear and thickness expansion mode resonators is a function of the thickness of the piezoelectric material, one satisfactory manner of obtaining the desired frequency relationship is to fabricate wafer 12 so that the thickness dimension is different between the respective pairs of electrodes. However, inasmuch as the frequency difference and, consequently the difference in thickness, is small, it is preferred to make wafer 12 of uniform thickness (so that both dot resonators would have the same fundamental resonant frequency) and to obtain the frequency difference by increasing the thickness dimension of the electrodes of one of the dot resonators. Of course, a combination of wafer and electrole thickness may be resorted to for adjusting the frequencies.

In the illustrated embodiment, as best appears in FIGURE 3, electrodes of different thickness are shown for frequency adjustment, the degree of difference being greatly exaggerated for clarity of illustration. Thus, electrodes 18 and 22, being thinner than electrodes 20 and 24, confer on the corresponding resonator 26 a fundamental resonant frequency which is higher than that of resonator 28 by an appropriate amount. As previously mentioned any frequency difference sufficient to make an effective ladder filter may be used. For the purpose of example throughout this description, it will be assumed that the resonant frequencies of respective resonators are such that they are either resonant or anti-resonant at the center frequency of the desired pass-band. In keeping with this assumption, then, dot resonator 26 would have a fundamental resonant frequency centered in the desired pass-band and coinciding with the anti-resonant frequency of dot resonator 28.

Aside from the adjustment achieved by variation of electrode thickness and similar expedients, the thickness of the wafer is determined basically by the desired operating frequency of the filter. The remaining critical design parameters are the area of the electrodes and the lateral spacing of electrodes from one another and from the edge of the wafer.

The effective area of the electrodes of the respective resonators is important and is a function of the material and thickness dimension of wafer 12. While this area can be adjusted within limits so as to obtain the desired impedance, it is necessary to limit the maximum size in order to obtain a clean response. Referring to FIGURES 2 and 3, with a ceramic wafer the ratio of electrode diameter D to wafer thickness T should not appreciably exceed 12 for a fundamental mode; preferably $D/T$ is in the range 4 to 8.

With a quartz wafer $D/T$ ratios up to 24 have been used at the fundamental but values of 12 to 18 are preferred. In any case, higher order harmonics require lower values of $D/T$.

The parameter of greatest importance to the attainment of independent vibration of the individual resonators—which is of the essence of the present invention—is that referred to hereinafter as "range of action," R, and defined as the distance in wafer thicknesses within which a physical disturbance will measurably affect the behavior of an individual resonator. Range of action is a composite of an electrical effect, stemming from fringing electric fields, and a mechanical effect, concerned with the propagation of a coherent mechanical signal through the wafer.

Range of action is a function of the physical properties of the wafer material and electrode configuration. It has been found that, by proper control of variables such as electrode size and spacing relative to wafer thickness, it becomes possible to achieve substantially independent resonator operation with a plurality of resonators on a single wafer of relatively small size, i.e., of a size feasible for use in sub-miniature circuits and occupying only a tiny fraction of the space required by comparable conventional components. By "substantially independent," as used in this description and the subjoined claims, is meant free from perceptible interaction so that a filter network formed of a plurality of dot resonators performs as well as the same network made up of separate resonators.

Considering first the electrical component of range of action, it has been found that the electric field drops off rapidly beyond the edge of the electrodes and that fringing fields one wafer thickness beyond the electrode edge are negligible, even for ceramic materials having high dielectric constants. This holds true for the case of a single counterelectrode covering the entire surface of the wafer as well as where individual counterelectrodes are used.

The major contributor to the range of action is the mechanical effect and here there is a substantial difference between ceramic and monocrystalline wafers. For ceramic the range of action, R, has been found to be from about 6 to 12, i.e., 6 to 12 wafer thicknesses, T. In a fine-grained ceramic of good physical quality, the value is closer to the upper limit. In quartz, the range of action is roughly 2 to 3 times that of ceramic, e.g., R is equal to about 15 to 30 wafer thicknesses.

The values of R and T determine the minimum lateral spacing S of the electrodes with respect to each other and spacing S′ with respect to the peripheral edges of the wafer: S and S′ should have a numerical value equal to at least RT and preferably greater than 2RT. The maximum spacing would be governed primarily by the importance of minimizing the wafer dimensions and the size of wafers available as a practical matter. The spacing, S′, with respect to the edge of the wafer appears to be less critical and a value of RT may be sufficient. The spacing S and S′ for ceramic wafers preferably exceeds 12T and for quartz wafers 25T. At this juncture it is pointed out that, the differences in wafer thickness which may be resorted to for obtaining the desired frequency relationships as described above would not be of such magnitude as to significantly effect $D/T$ and RT.

Filter component 10 illustrated in FIGURES 1 and 2 is the simplest form of element embodying the invention. The shape and lateral dimensions of wafer 12 are such as to minimize the size of the element and the amount of unnecessary piezoelectric material. As an example of the actual dimensions involved, element 10 designed for nominal ten megacycle operation with dot resonators operating at the fundamental and utilizing a ceramic wafer for broad-band response would have a wafer thickness dimension of about 8 mils. In accordance with the dimensional parameters given above based on a $D/T$ ratio of 8 and $S=S'=10T$, the diameters of electrodes 18 and 20 would be about 64 mils and wafer 12 would be 0.30 inch long and 0.22 inch across.

In a narrow band version using an AT-cut quartz wafer (6.6 mils thick for 10 mc. operation), a $D/T$ ratio of 18, and $S=S'=20T$, the over-all dimensions of wafer 12 would be 0.59 x 0.44 inch.

FIGURE 3 illustrates, in schematic form, terminal connections applied to the electrodes of element 10 for operation as an L-section filter. Thus, conductor 30 connects electrode 18 to input terminal A, conductor 32 interconnects electrodes 22 and 24 to output terminal B, and conductor 34 connects electrode 20 to ground terminal G. In order to facilitate visual correlation with the equivalent circuit as drawn in FIGURE 4, the terminal connections illustrated in FIGURE 3 include grounded input and output terminals A′ and B′, respectively, to complete the circuit.

Referring now to the equivalent circuit in FIGURE 4, both the series arm and the shunt arm of the L-section consist of an inductor $L_m$ and capacitor $C_m$ connected in series and shunted by a capacitor $C_e$. This combination of $L_m$, $C_m$ and $C_e$, of course, is the accepted electrical equivalent of an electromechanical resonator neglecting losses, $L_m$, $C_m$ and $C_e$ being the analogs, respectively, of the mass, compliance and electrical capacitance of the resonator. As indicated by the broken line enclosures designated 26 and 28, the circuitry constituting the series and shunt arms of the L-section is embodied in and replaced by the correspondingly numbered resonators of element 10. This manner of correlating individual resonators to equivalent circuitry is adhered to throughout the drawings.

Referring to FIGURE 5 there is illustrated a filter element 10′ in all respects identical to that shown in FIGURE 1 but having electrodes 22 and 24 interconnected in an L-section configuration by means of a stripe 32′ of conductive material applied directly to major surface 16 of wafer 12 in any suitable manner such as are well-known in the printed circuit field. Thus, it will be appreciated that a complete L-section filter is incorporated in a single element which, for a ten megacycle frequency, would have a volume of 0.0005 cubic inch (based on use of a ceramic wafer).

Referring now to FIGURES 6, 7 and 8, there is illustrated another embodiment of the invention taking the form of a piezoelectric resonator element 110. This resonator comprises a relatively thin flat wafer 112 of a monocrystalline or ceramic piezoelectric material as previously explained. On the major surfaces 114 and 116 of wafer 112 are three circular electrodes **118*a*, 118*b*, 120 and respective counterelectrodes 122*a*, 122*b*, 124 arrayed in opposition to form three piezoelectric resonators 126*a*, 126*b* and 128**. The values for diameter of the electrodes and spacing therebetween and from the edge of the wafer are selected in accordance with the foregoing general discussion of these parameters. Specific dimensions and results are presented hereinbelow.

While any pattern of distribution of the electrodes on plate 112 which conforms to the above-stated requirements may be employed, in the interests of minimum overall size of the element, the electrodes are shown as having their respective centers at the apices of an equilateral triangle centered on wafer 112, which is circular in form. As best shown in FIGURE 8, electrodes **118*a*, 118*b*, 122*a*, 122*b* are of uniform thickness so that corresponding resonators 126*a* and 126*b* have a common fundamental resonant frequency. Electrodes 120 and 124 of the third resonator 128 are somewhat thicker by an amount necessary to give this resonator a fundamental frequency of anti-resonance substantially coincident with the fundamental resonant frequency of resonators 126*a* and 126*b***. This particular frequency relationship is selected for an element operative as a T-section filter as will presently appear.

The electrodes on one major surface of wafer 112, e.g., electrodes **122*a*, 122*b* and 124 on surface 116, are electrically interconnected as by stripes of conductive material 132′ applied to said surface. Alternatively electrodes 122*a*, 122*b* and 124 could be replaced with a single large triangular electrode of sufficient size to oppose electrodes 118*a*, 118*b* and 120 on major surface 114, or surface 116 entirely covered with a single electrode. Electrode 118*a* is connected to input terminal A by conductor 130; electrode 118*b* to output terminal B by conductor 132; and electrode 120 to ground by conductor 134. Individual stripes of conductive material (not shown) on major surface 114 may be used to provide terminal connections at the edges of wafer 112** if desired.

Figures 9, 10, 11:
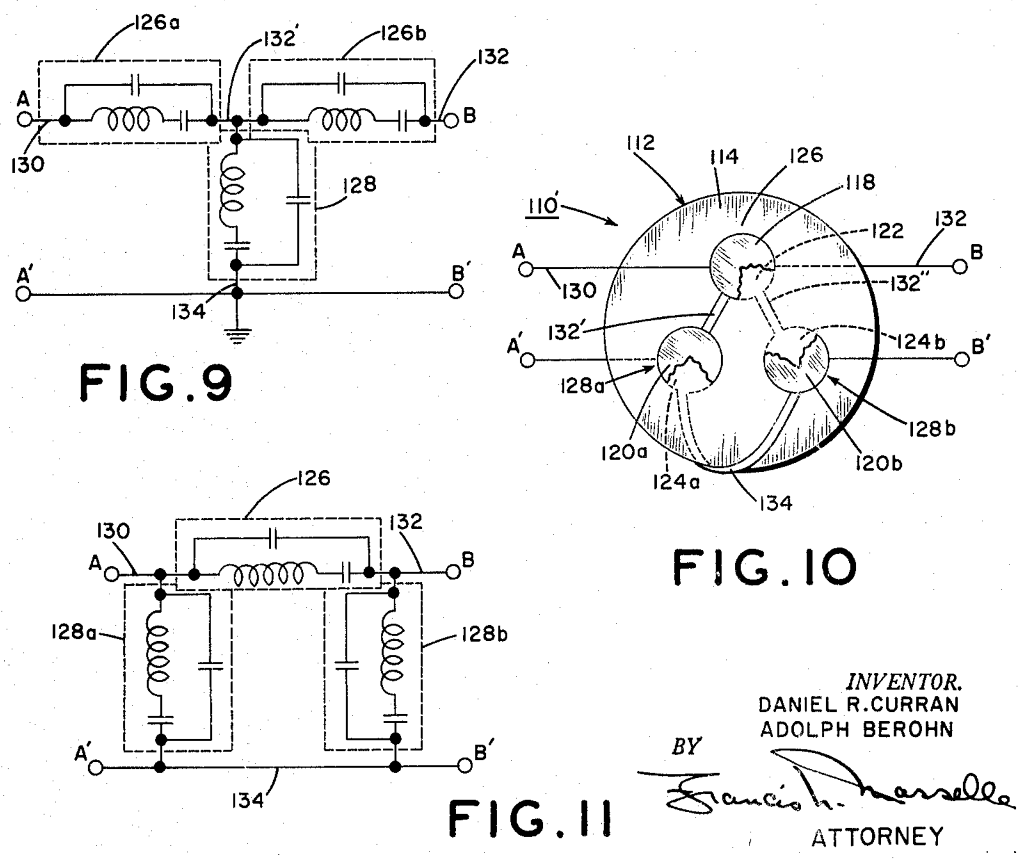
FIGURE 9 is a schematic representation of the equivalent circuit of the component shown in FIGURES 6, 7 and 8.
FIGURE 10 is a view similar to FIGURE 7 showing a further modification of the filter component.
FIGURE 11 is a diagrammatic representation of the equivalent circuit of the filter component shown in FIGURE 10.

The equivalent circuit of filter element 110 with the electrodes interconnected as shown in FIGURE 8 is illustrated in FIGURE 9. It will be readily appreciated from the equivalent circuit that element 110 operates as a T-section filter consisting of resonators 126*a* and 126*b*, having the same fundamental resonant frequency (centered in the pass-band) connected in series to form the series arm of the section, and resonator 128, anti-resonant at the center frequency of the pass-band, forming the shunt arm of the T-section.

By changing the frequency relationships of the respective resonators of element 110 and appropriate interconnection of the electrodes, a "pi"-section filter element 110' (FIGURE 10) is obtained. In element 110' the thicknesses are selected so that one resonator only (126) has its fundamental resonance frequency at the center of the pass-band and the remaining two resonators (128*a* and 128*b*) have their fundamental anti-resonant condition substantially coinciding with this frequency. For achieving a "pi"-section, the electrodes of element 110' may be interconnected as follows:

Electrode 118 of series resonator 126 is connected to electrode 120*a* by a stripe of conductive material 132' on the upper surface of wafer 112 as viewed in FIGURE 10. The other eletcrode, 122, of series resonator 126 is connected to the electrode 124*b* of shunt resonator 128*b* by a stripe 132'' of conductive material on the underside of wafer 112. The remaining two electrodes, 124*a* and 120*b* of shunt resonators 128*a* and 128*b*, respectively, are interconnected in any suitable manner as diagrammatically indicated by conductor 134. In practice this may be accomplished by external wiring, by conductive striping extending over the edge of the wafer 112, or by providing the conductive stripe on the edge of the wafer with branches extending to the electrodes as required. By comparison of FIGURE 10 with the equivalent circuit shown in FIGURE 11 it will be understood that series resonator 126 forms the series arm of a "pi"-section between input terminal A and output terminal B, shunt resonators 128*a* and 128*b* forming the shunt arms.

By applying the principles of the invention a wide variety of complex filter networks of any reasonable number of meshes can be reduced to a single relatively simple monolithic element as will now be explained for two forms of symmetrical band-pass ladder filters.

Figures 12, 13, 15:
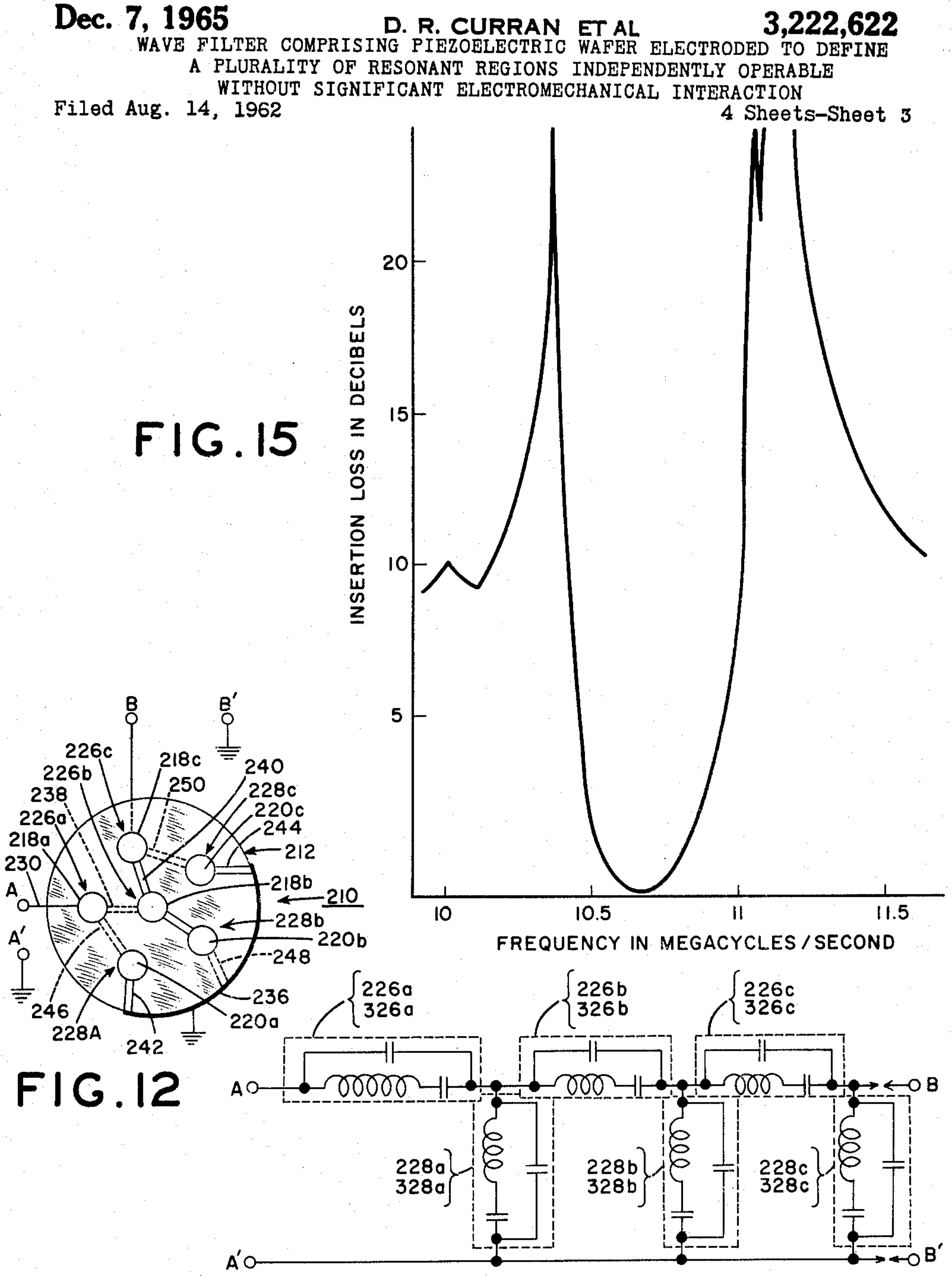
FIGURE 12 is a top plan view of another exemplary embodiment of the invention, a single component three mesh ladder filter.
FIGURE 13 is a diagrammatic representation of the equivalent circuit of the ladder filter shown in FIGURE 12.
FIGURES 15–18 are graphic representations of the frequency response characteristic of various filter components in accordance with the invention.

FIGURE 12 illustrates a symmetrical ladder filter element 210 embodying a circular wafer 212 of piezoelectric material. Six circular electrodes 218*a*, 218*b*, 218*c*, 220*a*, 220*b* and 220*c* and six counterelectrodes (not visible) are provided on the respective upper and lower surfaces of the wafer 212, arrayed in opposition to form six resonators 226*a*, 226*b*, 226*c*, 228*a*, 228*b*, 228*c*. The electrodes are dimensioned and spaced in accordance with the principles and requirements hereinabove described. On a portion of its edge, wafer 212 is provided with a peripheral electrode 236 extending somewhat less than half the circumference of the plate and serving as a ground terminal. Resonators 226*a*, 226*b* and 226*c*, by virtue of their electrode thickness and/or the thickness dimension of the intervening piezoelectric material, are resonant at the center of the desired pass-band; these resonators are connected in series as by a conductive stripe 238 on the undersurface of wafer 212 extending between the counterelectrodes (not shown) of resonators 226*a* and 226*b*, and a conductive stripe 240 on the upper surface of the plate extending between electrodes 218*b* and 218*c*. The input connection, represented by terminal A and conductor 230, goes to electrode 218*a* and the output, represented by terminal B, is taken from the counterelectrode of resonator 226*c*. The remaining three resonators (228*a*, 228*b*, 228*c*) are shunt resonators, and are connected between ground strip 236 and respective points of common potential intermediate adjacent series resonators. To this end conductive stripes 242 and 244 on the upper surface of wafer 212 connect the upper electrodes 220*a* and 220*b* of resonators 228*a* and 228*c*, respectively, to ground strip 236 and the upper electrode 220*b* of resonator 228*b* to the upper electrode 218*b* of series resonator 226*b*. On the underside of wafer 212 as viewed in FIGURE 12, conductive stripe 246 interconnects the respective bottom electrodes of series resonator 226*a* and shunt resonator 228*a*; conductive stripe 248 connects the bottom electrode of shunt resonator 228*b* to ground strip 236; and conductive stripe 250 interconnects the bottom electrodes of series and shunt resonators 226*c* and 228*c*. The equivalent circuit of filter element 210 is shown in FIGURE 13, reading reference numbers in the 200 series.

Figure 14:
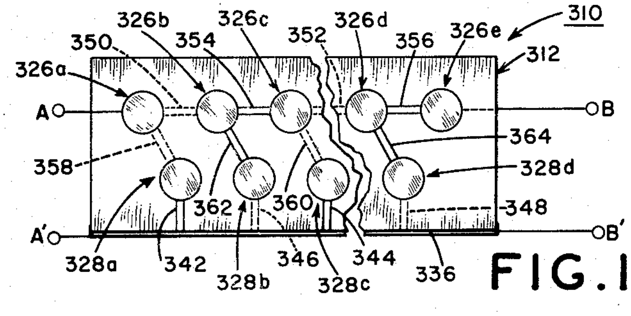
FIGURE 14 illustrates in top plan view another form of single component ladder filter embodying the invention.

Particularly for ladder filters having a large number of meshes it is preferable to employ a plate of piezoelectric material of elongated rectangular form as will now be described with reference to filter element 310 in FIGURE 14.

Resonator element 310 is a ladder filter of an indeterminate number of meshes and comprises a relatively long thin rectangular wafer 312 of piezoelectric material. On the upper surface of wafer 312 (as viewed in FIGURE 14) and to one side of the longitudinal center line of the plate, is a number of electrodes (five shown) disposed in a straight row and spaced inwardly from the edge of the wafer and from each other in accordance with the requirements already set forth. A like number of counterelectrodes (not visible in the figure) is provided on the undersurface of wafer 312 in respective opposition to the upper electrodes and coacting therewith to form respective resonators 326*a*, 326*b* . . . 326*e*. Inasmuch as 326*a* . . . 326*e* are to constitute the series arms of the ladder filter, the thickness of the wafer and/or electrodes is selected to impart to these resonators a fundamental resonant frequency centered in the desired pass-band.

On the opposite side of the longitudinal center line of wafer 312, with respect to the series resonators, is a second row of electrodes (four shown) spaced from each other and the edge of the wafer in the manner already described. In order to minimize the required width of wafer 312, placement of the second row of electrodes is staggered with respect to series resonators 326*a* . . . 326*e*. Counterelectrodes, not visible in FIGURE 14, are disposed on the underside of wafer 312 in opposition to the second row electrodes on the upper surface so as to coact therewith to form respective resonators 328*a* . . . 328*d*. Wafer 312 and/or the electrodes forming resonators 328*a* . . . 328*d* have sufficiently greater thickness dimension than series resonators 326*a* . . . 326*e*, as to impart to the former resonators an anti-resonant frequency which substantially coincides with the resonant frequency of the series resonators.

The edge of wafer 312 closest to shunt resonators 328*a* . . . 328*d* is provided with a ground strip 336. To strip 336 are connected, by means of suitable conductive stripes 342, 344 on the upper surface of wafer 312, the upper electrodes of shunt resonators 328*a* and 328*c* and, by stripes 346, 348 on the underside of the wafer, the bottom electrodes of resonators 328*b* and 328*d*.

Conductive stripes 350 and 352 on the undersurface of wafer 312 interconnect, respectively, the bottom electrodes of resonators 326*a* and 326*b* and the bottom electrodes of resonators 326*c* and 326*d*. Conductive stripes 354 and 356 on the upper surface of wafer 312 interconnect the top electrodes of resonators 326*b* and 326*c* and the top electrodes of resonators 326*d* and 326*e*, respectively. Thus, resonators 326*a* . . . 326*e* are connected in series between input terminal A and output terminal B.

Conductive stripes 358 and 360 on the undersurface of wafer 312 interconnect the bottom electrodes of resonators 326*a* and 328*a* and the bottom electrodes of resonators 326*c* and 328*c*, respectively. Conductive stripes 362 and 364 on the upper surface of the wafer interconect the top electrodes of resonators 326*b* and 328*b* and the top electrodes of resonators 326*d* and 328*d*, respectively. Thus, each of the shunt resonators is connected between ground and a respective point of common potential intermediate adjacent series resonators. The equivalent circuit shown in FIGURE 13 for ladder filter element 210 serves also for three meshes of element 310, by reading of the 300 series reference numerals.

While a relatively large number of exemplary embodiments have been described, it will be apparent to those skilled in the art that an almost limitless number of specific variations and combinations are possible and can be resorted to by persons skilled in the art to obtain the particular filter network desired. A number of individual resonator elements, such as shown in any of the particularly described embodiments, may be disposed in stacked arrays with suitable mountings and provisions for terminal contacts.

Referring now to FIGURE 15 there is graphically presented the band-pass characteristic of a typical T-section filter element such as illustrated in FIGURE 8. The particular filter element consisted of a circular wafer of piezoelectric ceramic material having a diameter of 0.350 inch and a substantially uniform thickness of 8 mils. The series resonators were tuned to a center frequency of 10.6 megacycles. The electrodes had a diameter of $\frac{3}{64}$ inch and were spaced from each other and the edge of the wafer by a distance of $\frac{1}{16}$ inch. The entire unit had a volume of about 0.0008 cubic inch exclusive of leads.

Following is a tabulation of characteristics for additional specific examples of filters according to the present invention, all components having three dot resonators being of the general physical configuration shown in FIGURES 6, 7 and 8 and those having more than three dot resonators being of the general configuration exemplified by FIGURE 12.

Other uses of monolithic components with independent dot resonators might be for noncomposite banks of oscillators or discriminators, or a single-unit oscillator-filter-discriminator combination.

While there have been described what are at present considered to be the preferred embodiments of this invention, it will be obivous to those skilled in the art that various changes and modifications may be made therein without departing from the invention, and it is, therefore, aimed in the appended claims to cover all such changes and modifications as fall within the true spirit and scope of the invention.

What is claimed and desired to be secured by United States Letters Patent is:

1. A piezoelectric circuit component comprising: a relatively thin wafer of piezoelectric material having a relatively smooth surface finish; at least two spaced electrodes positioned on one major surface of said wafer, counter electrode means positioned on the opposite major surface of said wafer in opposition to said electrodes; said electrodes and counter electrodes means coacting with the intervening piezoelectric material to form at least two individual resonators independently vibratory in a thickness mode of vibration; each of said resonators having a predetermined range of electro-mechanical action (R) in wafer thicknesses in said wafer material surrounding its electrode on said one major surface within which an electro-mechanical action is excited by the resonator and beyond which no significant electro-mechanical action is present, the range of action being a function of the physical properties of the wafer material and electrode configuration; said electrodes on said one major surface being spaced from each other and the wafer edge by a distance in the range of RT to 10RT where (T) is the wafer thickness to provide simultaneous independent operation of said resonators without significant electro-mechanical interaction.

| Example Number | 1 | 2 | 3 | 4 | 5 |
|---|---|---|---|---|---|
| Number of resonators | 3 | 7 | 3 | 3 | 5 |
| Type of section | T | Triple T | T | T | Double T |
| Wafer material | Ceramic | Ceramic | Quartz | Quartz | Quartz |
| Wafer diameter (inches) | 0.60 | 0.60 | 1.00 | 1.00 | 1.00 |
| Wafer thickness (inches) | 0.008 | 0.008 | 0.0066 | 0.0033 | 0.0066 |
| Electrode diameter (inches) | 0.05 | 0.05 | 0.12 | 0.075 | 0.12 |
| Electrode spacing (S) (inches) | 0.15 | 0.12 | 0.3 | 0.2 | 0.23 |
| Electrode spacing (S′) (inches) | ---------- | 0.09 | 0.2 | 0.3 | 0.2 |
| Nominal frequency (mc.) | 10 | 10 | 10 | 20 | 10 |
| Center frequency (mc.) | 11.57 | 10.05 | 9.85675 | 19.66176 | 9.90750 |
| Matching resistance (K ohms) (input and output) | 0.50 | 0.22 | 6.8 | 2.2 | 5.2 |
| Minimum insertion loss (db) | 2.3 | 4 | 0.8 | 2.0 | 1.0 |
| Bandwidth at— | | | | | |
| 3 db (kc.) | 259 | 224 | 15.74 | 76.30 | 23.77 |
| 6 db (kc.) | 334 | 269 | 18.58 | 84.31 | 29.16 |
| 10 db (kc.) | 395 | 300 | 22.01 | 93.51 | 32.90 |
| 20 db (kc.) | ---------- | 350 | 29.56 | 108.75 | 37.58 |
| 30 db (kc.) | ---------- | 370 | 34.07 | ---------- | 41.08 |
| Stop band rejection (below minimum loss) (db) | 7.8 | 17 | ---------- | 8 | 13.7 |

Figure 16:
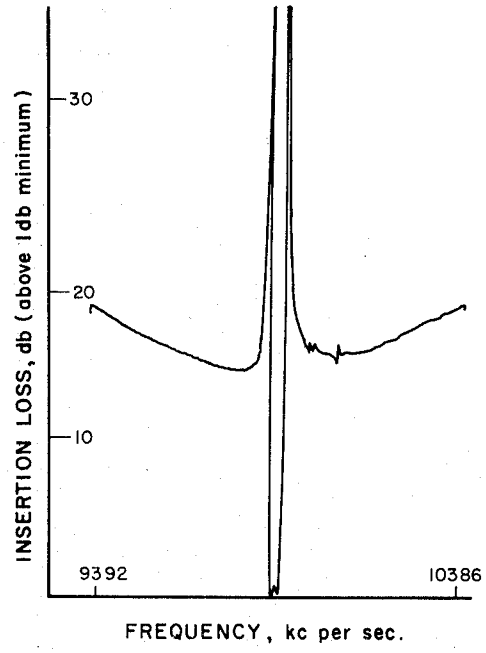
Figure 17:
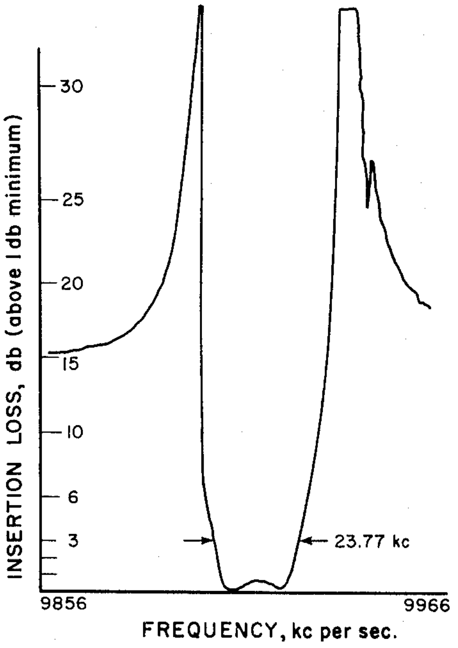
Figure 18:
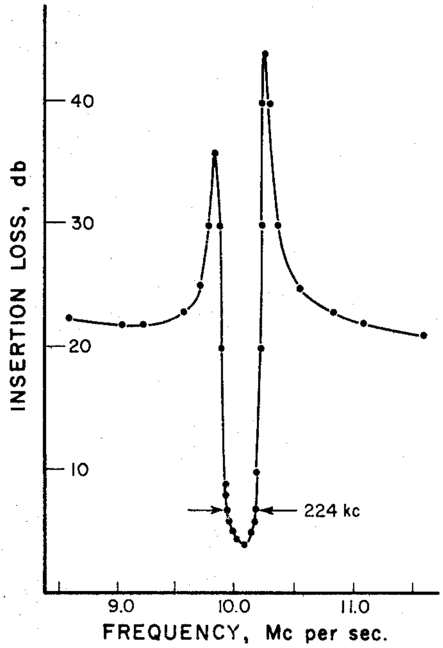

The response characteristic of example unit number 5 is shown in FIGURE 16 over an extended frequency range; more detailed pass-band characteristics are given in FIGURE 17 also for example unit number 5 and in FIGURE 18 for example unit number 2.

It should be noted that, as previously mentioned, the results obtained with monolithic filter components in accordance with the present invention in each case are comparable with those obtainable using conventional separate resonators electrically interconnected to form analogous filter networks.

It will be understood that while the invention has been described with reference to T and "pi" sections and ladder filters, the principle involved is susceptible of broader applications both in the field of wave filters and in others.

Of particular importance in the filter field are lattice-type networks in which the quartz-wafer embodiment would be of particular value.

2. A piezoelectric circuit component comprising: a relatively thin wafer of piezoetlectric material having a relatively smooth surface finish; at least two spaced electrodes positioned on one major surface of said wafer; counter electrode means positoned on the opposite major surface of said wafer in opposition to said electrodes; said electrodes and counter electrode means coacting with the intervening piezoelectric material to form at least two individual resonators independently vibratory in a thickness mode of vibration; each of said resonators having a predetermined range of electro-mechanical action (R) in wafer thicknesses in said wafer material surrounding its electrode on said one major surface within which an electromechanical action is excited by the resonator and beyond which no significant electro-mechantical action is present, the range of action (R) being a function of the physical properties of the wafer material and electrode configuration and having a value of less than 30 wafer thicknesses; said electrodes on said one major surface being spaced from each other and the wafer edge by a distance at least equal to RT where (T) is the wafer thickness to provide simultaneous independent operation of said resonators without significant electro-mechanical interaction.

3. A piezoelectric circuit component as claimed in claim 2 wherein said electrodes on said one major surface comprise dot electrodes.

4. A piezoelectric circuit component as claimed in claim 3 wherein said wafer is formed from ferroelectric ceramic material and said resonators having a thickness shear mode of vibration.

5. A piezoelectric circuit component as claimed in claim 3 wherein said wafer is formed from quartz material and said resonators have a thickness shear mode of vibration.

6. A piezoelectric circuit component comprising: a relatively thin wafer of piezoelectric material having a relatively smooth surface finish; at least two spaced electrodes positioned on one major surface of said wafer; counter electrode means positoned on the opposite major surface of said wafer in opposition to said electrodes; said electrodes and counter electrode means coacting with the intervening piezoelectric material to form at least two individual resonators independently vibratory in a thickness mode of vibration; each of said resonators having a predetermined range of electro-mechanical action (R) in wafer thicknesses in said wafer material surrounding its electrode on said one major surface within which an electro-mechanical action is excited by the resonator and beyond which no significant electro-mechanical action is present, the range of action (R) being a function of the physical properties of the wafer material and electrode configuration and having a value from about 6 to 30 wafer thicknesses; said electrodes on said one major surface being spaced from each other and the wafer edge by a distance at least equal to RT where (T) is the wafer thickness to provide simultaneous independent operation of said resonators without significant electro-mechanical interaction.

7. A circuit component as claimed in claim 6 wherein said resonators have different resonant frequencies.

8. A piezoelectric circuit component according to claim 7 wherein the resonant frequency of one of said resonators at a given harmonic differs from that of the other by an amount equal to from 5 to 110 percent of the frequency difference between resonance and anti-resonance at said harmonic.

9. A piezoelectric circuit component according to claim 8 wherein the resonant frequency of one of said resonators at a given harmonic substantially coincides with the anti-resonant frequency of the other at said harmonic.

10. A piezoelectric circuit component according to claim 8 wherein said piezoelectric material is a polarizable ferroelectric ceramic and at least those portions of the material intervening between said electrodes and counterelectrode means are polarized to render the material responsive in a thickness mode to an applied field normal to said major surfaces.

11. A piezoelectric circuit component according to claim 10 wherein said electrodes have a maximum lateral dimension not more than twelve times the thickness of said wafer and said electrodes are spaced from one another and the edge of said wafer by distances equal to at least six times the thickness of said wafer.

12. A piezoelectric circuit component according to claim 11 wherein said material is polarized substantially perpendicular to the major surfaces of said wafer.

13. A piezoelectric circuit component according to claim 11 wherein said material is polarized substantially parallel to the major surfaces of said wafer.

14. A piezoelectric circuit component according to claim 8 wherein said wafer is a slice of quartz crystal responsive in a thickness mode to a field normal to its major surfaces.

15. A piezoelectric circuit component according to claim 14 wherein said electrodes have a maximum lateral dimension not more than 24 times the thickness of said wafer and are spaced from one another and the edge of said wafer by distances equal to at least 15 times the thickness of said wafer.

16. A piezoelectric circuit component according to claim 15 wherein the resonant frequency of one of said resonators at a given harmonic substantially coincides with the anti-resonant frequency of the other at said harmonic.

17. A piezoelectric circuit component comprising: a relatively thin wafer of piezoelectric material having at least three substantially circular spaced dot electrodes on one major surface and counterelectrode means on the other major surface arrayed in opposition to said electrodes, the aggregate area of the dot electrodes on said one major surface being substantially less than the area of the surface, said dot electrodes and counterelectrode means coacting with the intervening piezoelectric material to form at least three individual dot resonators spaced from one another and the edges of the wafer by a distance equal to at least twice the range of action of the resonators and being independently vibratory in the same thickness made at pre-selected resonant frequencies differing by an amount equal to from 5 to 110 percent of the frequency difference between resonance and anti-resonance of said dot resonators.

18. A piezoelectric circuit component according to claim 17 wherein said counterelectrode means consists of additional dot electrodes on said other major surface, each substantially conforming in size and shape, and disposed opposite to, a respective dot electrode on said one major surface.

19. A piezoelectric circuit component according to claim 18 wherein said material is a piezoelectric ceramic, the dot electrodes on said one major surface are spaced from each other and the edge of said wafer by a distance greater than 12 times the thickness of said wafer, and the maximum lateral dimension of the electrodes on said one major surface is from four to eight times the thickness of said wafer.

20. A piezoelectric component according to claim 19 wherein said ceramic material is polarized in a direction substantially perpendicular to said major surfaces at least in those regions of the wafer intervening between said electrodes and counterelectrodes.

21. A piezoelectric circuit component according to claim 20 including electrically conductive means selectively interconnecting electrodes and counterelectrodes on said wafer in a predetermined circuit configuration.

22. A piezoelectric component according to claim 19 wherein said ceramic material is polarized in a direction substantially parallel to said major surfaces at least in those regions of the wafer intervening between said electrodes and counter-electrodes.

23. A piezoelectric circuit component according to claim 22 including electrically conductive means selectively interconnecting electi odes and counterelectrodes on said wafer in a predetermined circuit configuration.

24. A piezoelectric circuit component according to claim 18 wherein said material is quartz, the electrodes on said one major surface are spaced from each other and the edge of said wafer by a distance greater than 25 times the thickness of said wafer, and the maximum lateral dimension of the electrodes on said one major surface is from 12 to 18 times the thickness of said wafer.

25. A piezoelectric circuit component according to claim 24 including electrically conductive means selectively interconnecting electrodes and counterelectrodes on said wafer in a predetermined circuit configuration.

26. A piezoelectric circuit component according to claim 25 wherein the crystallographic orientation of the wafer is such that the mode of response is thickness expansion.

27. A piezoelectric circuit component according to claim 25 wherein the crystallographic orientation of the wafer is such that the mode of response is thickness shear.

28. A piezoelectric circuit component for electric wave filters comprising: a wafer of piezoelectric ceramic material having a plurality of electrodes on each major surface arrayed in opposition to form a plurality of electrode pairs, said electrodes being of substantially circular configuration and having a diameter not substantially greater than eight times the thickness dimension of said wafer and being spaced from each other and the edge of said wafer by a distance greater than 12 times the thickness of said wafer, each of said electrode pairs coacting with the intervening piezoelectric material to form individual resonators independently vibratory in the same thickness expansion mode, a finite number of said resonators having a resonant frequency substantially coinciding with the anti-resonant frequency of the remaining resonators.

29. A symmetrical band-pass ladder filter comprising: a piezoelectric circuit component according to claim 28 wherein the algebraic difference between said finite number of resonators and the number of said remaining resonators is not greater than one; means electrically interconnecting said finite number of resonators in series; means electrically interconnecting one electrode of each of said remaining resonators; and means connecting the other electrode of each of said remaining resonators to a respective point of common potential intermediate adjacent ones of said resonators in series.

30. A piezoelectric circuit component for electric wave filters comprising: a wafer of piezoelectric material having a plurality of electrodes on each major surface arrayed in opposition to form a plurality of electrode pairs, said electrodes being of substantially circular configuration and having a diameter not substantially greater than 18 times the thickness dimension of said wafer and being spaced from each other and the edge of said wafer by a distance greater than 25 times the thickness of said wafer, each of said electrode pairs coacting with the intervening piezoelectric material to form individual resonators independently vibratory in the same thickness mode, a finite number of said resonators having a resonant frequency substantially coinciding with the anti-resonant frequency of the remaining resonators.

31. A symmetrical band-pass ladder filter comprising: a piezoelectric circuit component according to claim 30 wherein the algebraic difference between said finite number of resonators and the number of said remaining resonators is not greater than one; means electrically interconnecting said finite number of resonators in series; means electrically interconnecting one electrode of each of said remaining resonators; and means connecting the other electrode of each of said remaining resonators to a respective point of common potential intermediate adjacent ones of said resonators in series.

References Cited by the Examiner

UNITED STATES PATENTS

| | | | |
|---|---|---|---|
| 1,717,451 | 6/1929 | Hund | 333—72 |
| 2,271,870 | 2/1942 | Mason | 333—72 |
| 2,859,346 | 11/1958 | Firestone | 333—72 |
| 2,906,973 | 9/1959 | Mason | 333—72 |
| 2,943,278 | 6/1960 | Mattiat | 333—32 |
| 2,967,958 | 1/1961 | Kosowsky et al. | 310—9.4 |
| 2,969,512 | 1/1961 | Jaffe | 333—72 |
| 2,988,714 | 6/1961 | Tehon | 333—72 |
| 3,018,451 | 1/1962 | Mattiat | 333—62 |

References Cited by the Applicant

UNITED STATES PATENTS 2,799,789 7/1957 Wolfskill.

HERMAN KARL SAALBACH, *Primary Examiner.*